(12) United States Patent
Thompson

(10) Patent No.: US 7,667,610 B2
(45) Date of Patent: Feb. 23, 2010

(54) PRODUCING AN INDICATION OF SOLAR PANEL CONDITION BASED ON AGE AND ACTUAL POWER OUTPUT

(75) Inventor: Christopher Scott Thompson, Coquitlam (CA)

(73) Assignee: Xantrex Technology Inc., Burnaby, BC (CA)

( * ) Notice: Subject to any disclaimer, the term of this patent is extended or adjusted under 35 U.S.C. 154(b) by 346 days.

(21) Appl. No.: 11/797,584

(22) Filed: May 4, 2007

(65) Prior Publication Data

US 2008/0272279 A1 Nov. 6, 2008

(51) Int. Cl.
*G08B 21/00* (2006.01)
(52) U.S. Cl. .................... 340/657; 340/635; 136/244
(58) Field of Classification Search ........... 340/635, 340/657; 702/57, 59, 63, 183; 136/243, 136/244, 290; 320/101
See application file for complete search history.

(56) References Cited

U.S. PATENT DOCUMENTS 6,512,458 B1 * 1/2003 Kobayashi et al. .......... 340/635
6,892,165 B2 * 5/2005 Yagi et al. ................... 702/183

OTHER PUBLICATIONS http://www2/sma.de/en/solar-technology/products/communication/communication-products-software/sunny-sensorbox/overview/index.html, Oct. 27, 2006.
http://www.kippzonen.com/pages/1465, Feb. 6, 2008.
Radiation Measurement for Atmospheric Research and Industry, CMP Series, Pyranometer Range, Kipp & Zonen (http://www.kippzonen.com/download/kipp_brochure_cmp3_1660.pdf), Feb. 6, 2008.
SMA Sunny Sensorbox, Complete Performance Monitoring for the Optimal Solar Yield, SMA Technologie AG (http://download.sma-america.com/smaprosa/dateien/4148/SESOBOX-13-BE4606.pdf), Feb. 6, 2008.

* cited by examiner

*Primary Examiner*—Jeffery Hofsass

(57) ABSTRACT

A method and apparatus for producing an indication of solar panel condition is disclosed. The method involves receiving operating condition signals including an irradiance signal representing electromagnetic radiation received by the solar panel, and an age signal representing age of the solar panel. The method also involves receiving a power signal representing actual power output from the solar panel and producing a power estimate in response to the operating condition signals and irradiance and age adjustment factors. The power estimate represents an expected power output from the solar panel and the adjustment factors are for adjusting the irradiance signal and the age signal respectively. The method further involves causing a warning signal to be generated in response to a difference between the power signal and the power estimate.

72 Claims, 5 Drawing Sheets

PRODUCING AN INDICATION OF SOLAR PANEL CONDITION BASED ON AGE AND ACTUAL POWER OUTPUT

BACKGROUND OF THE INVENTION

1. Field of Invention

This invention relates generally to solar panels, and more particularly to methods and apparatus for monitoring the condition of solar panels.

2. Description of Related Art

Solar panels are used in solar power generation systems to produce electrical power. Solar panels generally produce direct current (DC) power which may be used to charge a bank of batteries. Alternatively, the DC power may be supplied to a power converter that converts the DC power into AC power suitable for supplying an AC power grid, for example.

Solar panels are generally mounted outdoors for exposure to the sun's radiation. Being outdoors they are also exposed to contamination by dirt and debris such as dust, sticks, leaves, or snow for example. Such contamination may not physically damage the solar panels, but can cause a reduction in electrical power output for a given insolation as it can reduce the amount of radiation that is able to reach the active areas of the panels.

In addition, as solar panels age their power output decrease by perhaps as much as 0.5% per year.

In general it is not always possible to determine whether a reduction in power output is due to lower irradiation levels, lower temperatures, contamination of the panels, or ageing. Since solar panels are often mounted inaccessible locations, regular visual inspection is not always feasible.

SUMMARY OF THE INVENTION

In accordance with one aspect of the invention there is provided a method for producing an indication of solar panel condition. The method involves receiving operating condition signals including an irradiance signal representing electromagnetic radiation received by the solar panel, and an age signal representing age of the solar panel. The method also involves receiving a power signal representing actual power output from the solar panel and producing a power estimate in response to the operating condition signals and irradiance and age adjustment factors. The power estimate represents an expected power output from the solar panel and the adjustment factors are for adjusting the irradiance signal and the age signal respectively. The method further involves causing a warning signal to be generated in response to a difference between the power signal and the power estimate.

Receiving the age signal may involve reading an age value from a store.

The method may involve storing the age value in the store.

The method may involve computing the age value in response to a signal received from a timer.

Producing the power estimate may involve computing the power estimate according to the relation:

$$P_e = xI - zA$$

where $P_e$ represents the power estimate, x represents the irradiance adjustment factor, I represents the irradiance signal, z represents the age adjustment factor, and A represents the age signal.

The method may involve receiving the irradiance adjustment factor.

The method may involve computing the irradiance adjustment factor.

Receiving the operating condition signals may involve receiving a temperature signal representing temperature of the solar panel and producing the power estimate may involve producing the power estimate in response to the operating condition signals and the irradiance and the age adjustment factors and a temperature adjustment factor, the temperature adjustment factor being operable to adjust the temperature signal.

Producing the power estimate may involve computing the power estimate according to the relation:

$$P_e = xI - zA - yT$$

where $P_e$ represents the power estimate, x represents the irradiance adjustment factor, z represents the age adjustment factor, A represents the age signal, I represents the irradiance signal, y represents the temperature adjustment factor, and T represents the temperature signal.

The method may involve producing the temperature signal.

Producing the temperature signal may involve operating a temperature sensor operably configured to sense a temperature of the solar panel.

Computing the irradiance adjustment factor may involve computing the irradiance adjustment factor according to the relation:

$$x = \frac{P_o + yT}{I_o}$$

where x represents the irradiance adjustment factor, $P_0$ represents the power signal at a reference time, $I_0$ represents the irradiance signal at the reference time, y represents the temperature adjustment factor, and T represents the temperature signal.

The method may involve storing the irradiance adjustment factor.

Causing the warning signal to be produced may involve causing the warning signal to be produced when the power signal represents an actual power output less than the power estimate.

Causing the warning signal to be produced may involve causing the warning signal to be produced when the power signal represents an actual power output that differs from the power estimate by more than a reference difference.

Causing the warning signal to be produced may involve actuating a light.

Causing the warning signal to be produced may involve causing a message to be displayed.

Causing the warning signal to be produced may involve causing a message to be transmitted to a messaging device.

The method may involve producing the warning signal.

The method may involve producing the power signal.

Producing the power signal may involve measuring current and voltage output from the solar panel and calculating an actual power value and producing the power signal in response to the actual power value.

The method may involve producing the irradiance signal.

Producing the irradiance signal may involve operating an irradiance measurement apparatus operably configured to produce the irradiance signal.

In accordance with another aspect of the invention there is provided a computer readable medium encoded with codes for directing a processor circuit to execute the methods above.

In accordance with another aspect of the invention there is provided a computer readable signal encoded with codes for directing a processor circuit to execute the method above.

In accordance with another aspect of the invention there is provided an apparatus for producing an indication of solar panel condition. The apparatus includes provisions for receiving operating condition signals including an irradiance signal representing electromagnetic radiation received by the solar panel, and an age signal representing age of the solar panel. The apparatus further includes provisions for receiving a power signal representing actual power output from the solar panel, and provisions for producing a power estimate in response to the operating condition signals and irradiance and age adjustment factors, the power estimate representing an expected power output from the solar panel and the adjustment factors for adjusting the irradiance signal and the age signal respectively. The apparatus also includes provisions for causing a warning signal to be generated in response to a difference between the power signal and the power estimate.

The provisions for receiving may include provisions for reading an age value from a store.

The apparatus may include provisions for storing the age value in the store.

The apparatus may include provisions for computing the age value in response to a signal received from a timer.

The provisions for producing the power estimate may include provisions for computing the power estimate according to the relation:

$$P_e = xI - zA$$

where $P_e$ represents the power estimate, x represents the irradiance adjustment factor, z represents the age adjustment factor, I represents the irradiance signal, and A represents the age signal.

The apparatus may include provisions for receiving the irradiance adjustment factor.

The apparatus may include provisions for computing the irradiance adjustment factor.

The provisions for receiving the operating condition signals may include provisions for receiving a temperature signal representing temperature of the solar panel and the provisions for producing the power estimate may include provisions for producing the power estimate in response to the operating condition signals and the irradiance and the age adjustment factors and a temperature adjustment factor, the temperature adjustment factor being operable to adjust the temperature signal.

The provisions for producing the power estimate may include provisions for computing the power estimate according to the relation:

$$P_e = xI - zA - yT$$

where $P_e$ represents the power estimate, x represents the irradiance adjustment factor, z represents the age adjustment factor, A represents the age signal, I represents the irradiance signal, y represents the temperature adjustment factor, and T represents the temperature signal.

The apparatus may include provisions for producing the temperature signal.

The provisions for producing the temperature signal may include provisions for sensing a temperature of the solar panel.

The provisions for computing the irradiance adjustment factor may include provisions for computing the irradiance adjustment factor according to the relation:

$$x = \frac{P_o + yT}{I_o}$$

where x represents the irradiance adjustment factor, $P_0$ represents the power signal at a reference time, $I_0$ represents the irradiance signal at the reference time, y represents the temperature adjustment factor, and T represents the temperature signal.

The apparatus may include provisions for storing the irradiance adjustment factor.

The provisions for causing the warning signal to be produced may include provisions for causing the warning signal to be produced when the power signal represents an actual power output less than the power estimate.

The provisions for causing the warning signal to be produced may include provisions for causing the warning signal to be produced when the power signal represents an actual power output that differs from the power estimate by more than a reference difference.

The provisions for causing the warning signal to be produced may include provisions for actuating a light.

The provisions for causing the warning signal to be produced may include provisions for causing a message to be displayed.

The provisions for causing the warning signal to be produced may include provisions for causing a message to be transmitted to a messaging device.

The apparatus may include provisions for producing the warning signal.

The apparatus may include provisions for producing the power signal.

The provisions for producing the power signal may include provisions for measuring current and voltage output from the solar panel and provisions for calculating an actual power value and producing the power signal in response to the actual power value.

The apparatus may include provisions for producing the irradiance signal.

The provisions for producing the irradiance signal may include provisions for operating an irradiance measurement apparatus operably configured to produce the irradiance signal.

In accordance with another aspect of the invention there is provided an apparatus for producing an indication of solar panel condition. The apparatus includes an operating condition receiver operably configured to receive operating condition signals including, an irradiance signal representing electromagnetic radiation received by the solar panel, and an age signal representing age of the solar panel. The apparatus also includes a power signal receiver operably configured to receive a power signal representing actual power output from the solar panel. The apparatus further includes a processor circuit operably configured to produce a power estimate in response to the operating condition signals and irradiance and age adjustment factors, the power estimate representing an expected power output from the solar panel and the adjustment factors for adjusting the irradiance signal and the age signal respectively. The processor circuit is also operably configured to cause a warning signal to be generated in response to a difference between the power signal and the power estimate.

The operating condition receiver may be operably configured to read an age value from a store.

The apparatus may include a memory store operably configured to store the age value.

The processor circuit may be operably configured to compute the age value in response to a signal received from a timer.

The processor circuit may be operably configured to compute the power estimate according to the relation:

$$P_e = xI - zA$$

where $P_e$ represents the power estimate, x represents the irradiance adjustment factor, z represents the age adjustment factor, I represents the irradiance signal, and A represents the age signal.

The apparatus may include a receiver for receiving the irradiance adjustment factor.

The processor circuit may be operably configured to compute the irradiance adjustment factor.

The receiver may be operably configured to receive a temperature signal representing temperature of the solar panel and the processor circuit may be operably configured to produce the power estimate in response to the operating condition signals and the irradiance and the age adjustment factors and a temperature adjustment factor, the temperature adjustment factor being operable to adjust the temperature signal.

The processor circuit may be operably configured to compute the power estimate according to the relation:

$$P_e = xI - zA - yT$$

where $P_e$ represents the power estimate, x represents the irradiance adjustment factor, z represents the age adjustment factor, A represents the age signal, I represents the irradiance signal, y represents the temperature adjustment factor, and T represents the temperature signal.

The apparatus may include a temperature sensor operably configured to sense a temperature of the solar panel and to produce the temperature signal.

The processor circuit may be operably configured to compute the irradiance adjustment factor according to the relation:

$$x = \frac{P_o + yT}{I_o}$$

where x represents the irradiance adjustment factor, $P_0$ represents the power signal at a reference time, $I_0$ represents the irradiance signal at the reference time, y represents the temperature adjustment factor, and T represents the temperature signal.

The apparatus may include a memory store operably configured to storing the irradiance adjustment factor.

The processor circuit may be operably configured to cause the warning signal to be produced when the power signal represents an actual power output less than the power estimate.

The processor circuit may be operably configured causing the warning signal to be produced when the power signal represents an actual power output that differs from the power estimate by more than a reference difference.

The processor circuit may be operably configured to actuate a light.

The processor circuit may be operably configured to cause a message to be displayed.

The processor circuit may be operably configured to cause a message to be transmitted to a messaging device.

The apparatus may include a power sensor operably configured to sense actual power output from the solar panel and to produce the power signal.

The apparatus may include a voltage sensor for sensing a voltage output from the solar panel and for producing a voltage signal representing the voltage output, a current sensor for sensing a current output from the solar panel and for producing a current signal representing the current output, a receiver for receiving the voltage signal and the current signal, and a processor circuit operably configured to calculate an actual power value from the current signal and the voltage signal and to produce the power signal in response to the actual power value.

The apparatus may include an irradiance sensor operably configured to producing the irradiance signal.

In accordance with another aspect of the invention there is provided a solar power system including the apparatus above and further including a solar panel, the solar panel being operable to produce an output power at an output power terminal, and an irradiance measuring apparatus operable to produce the irradiance signal.

The system may include a temperature sensor, the temperature sensor being operably configured to measure the temperature of the solar panel and to produce the temperature signal.

The system may include a solar panel interface, the interface being operably configured to receive the output power and to condition the power for use in driving a load.

The interface may be operably configured to produce the power signal.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

In drawings which illustrate embodiments of the invention.

DETAILED DESCRIPTION

Figure 1:
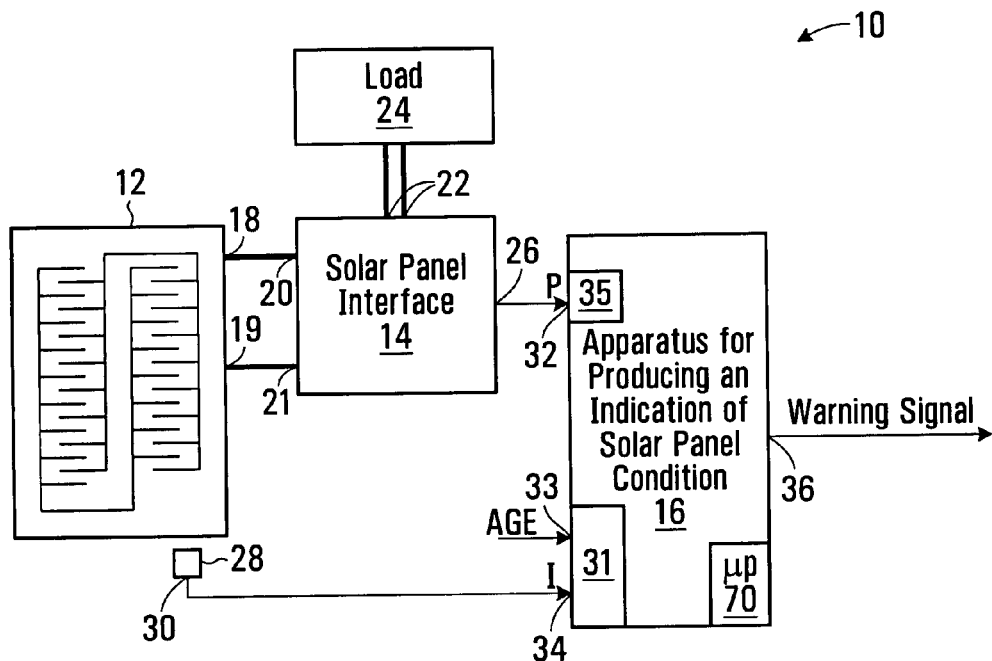
FIG. 1 is a schematic view of solar power generation system in accordance with a first embodiment of the invention.

Referring to FIG. 1, a solar power generation system according to a first embodiment of the invention is shown generally at 10. The system 10 includes a solar panel 12, a solar panel interface 14, and an apparatus 16 for producing an indication of solar panel condition.

The solar panel 12 may include a plurality of photovoltaic cells that are operable to convert light energy into electrical energy. The solar panel 12 includes a pair of output terminals 18 and 19, which facilitate connecting the solar panel to a load or an interface, for example.

The solar panel interface 14 includes input terminals 20 and 21 for receiving the output power from the respective output terminals 18 and 19 of the solar panel 12. The solar panel interface 14 also includes a pair of output terminals 22 for supplying output power to a load 24. The solar panel interface 14 is generally operable to receive input power at the terminals 20 and 21 and to convert the input power into an output power at the terminals 22 suitable for driving the load 24. The solar panel interface 14 may include a DC to AC inverter for supplying electrical power to an AC load such as an AC power grid, for example.

The solar panel interface 14 further includes an output 26 for producing a power signal representing actual power output from the solar panel 12.

The system 10 further includes an irradiance measuring apparatus 28, which includes an output 30 for producing an irradiance signal representing intensity of electromagnetic radiation received by the solar panel 12. The irradiance measuring apparatus 28 is located in general proximity to the solar panel 12, such that the irradiance received at the irradiance measuring apparatus is representative of the irradiance received at the solar panel. An exemplary irradiance measuring apparatus is a CMP3 pyranometer available from Kipp and Zonen USA Inc. of Bohemia N.Y. USA.

The apparatus 16 includes an operating condition receiver 31 operably configured to receive operating condition signals. The operating condition receiver 31 has an irradiance signal input 34 for receiving the irradiance signal representing electromagnetic radiation received by the solar panel and an age signal input 33 for receiving an age signal representing age of the solar panel. The age signal may be provided by a computer keyboard, for example, in response to user input. The apparatus 16 also includes a power signal receiver 35 having an input 32 for receiving the power signal representing actual power output from the solar panel.

The apparatus 16 further includes a processor circuit 70 operably configured to produce a power estimate in response to the operating condition signals, an irradiance adjustment factor, and an age adjustment factor. The irradiance and age adjustment factors may be provided as user input, for example or may be pre-programmed into the processor circuit 70. The irradiance and age adjustment factors are for adjusting the irradiance and age signals respectively and the power estimate represents an expected power output from the solar panel, taking into account the age and irradiance adjustment factors. The processor circuit 70 is also operably configured to cause a warning signal to be generated in response to a difference between the power signal and the power estimate. In the embodiment shown, the apparatus 16 includes an output 36 controlled by the processor circuit 70 for producing the warning signal.

Figure 2:
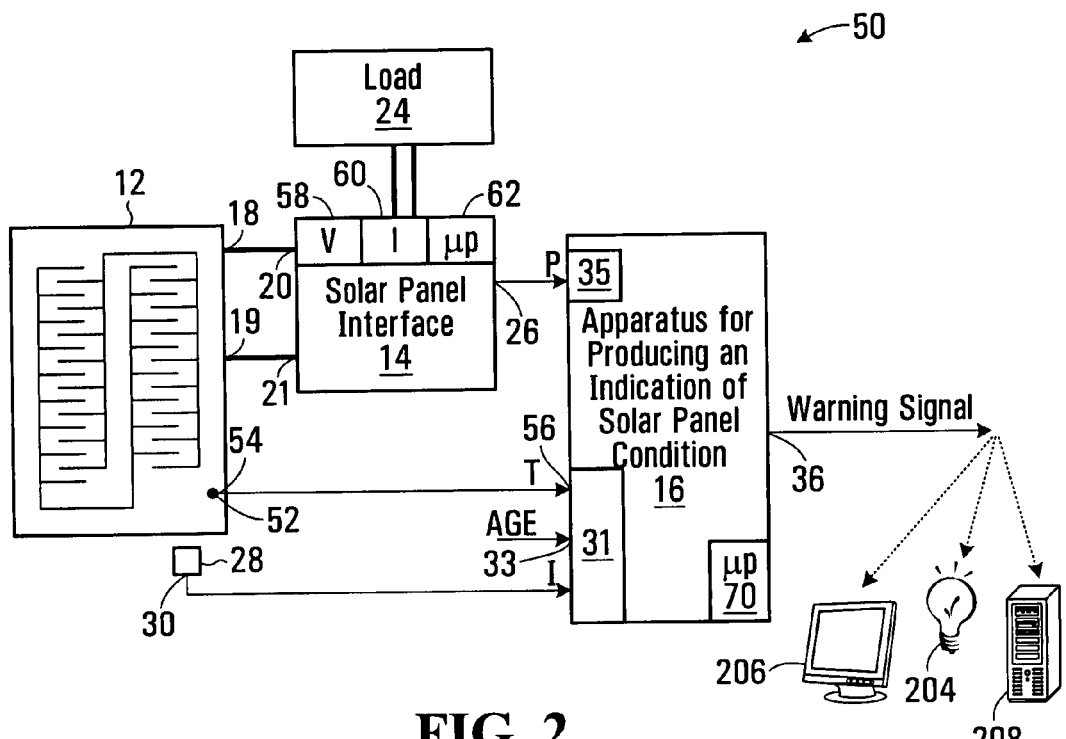
FIG. 2 is a schematic view of solar power generation system in accordance with a second embodiment of the invention.

Referring to FIG. 2, a second embodiment of a solar power generation system is shown generally at 50. The system 50 includes the solar panel 12, the solar panel interface 14, and the apparatus 16, as shown in FIG. 1. In this embodiment the solar panel 12 further includes a temperature sensor 52 operably configured to sense a temperature of the solar panel and having an output 54 for producing a temperature signal representing a temperature of the solar panel. In this embodiment the operating condition receiver 31 also includes an input 56 for receiving the temperature signal from the output 54 of the temperature sensor 52. The irradiance measuring apparatus 28 and/or the temperature sensor 52 may be wireless devices, for example.

In this embodiment, the processor circuit 70 is operably configured to produce a power estimate in response to the operating condition signals including the temperature signal, the age signal, the irradiance signal, a temperature adjustment factor, an irradiance adjustment factor, and an age adjustment factor. The temperature, irradiance and age adjustment factors may be provided as user input, for example, or may be pre-programmed into the processor circuit 70. The temperature, irradiance and age adjustment factors are for adjusting the temperature, irradiance and age signals respectively and the power estimate represents an expected power output from the solar panel, taking into account the temperature, age and irradiance adjustment factors. The processor circuit 70 is also operably configured to cause a warning signal to be generated in response to a difference between the power signal and the power estimate. In the embodiment shown, the apparatus 16 includes an output 36 controlled by the processor circuit 70 for producing the warning signal.

In one embodiment, the warning signal output 36 is coupled to a light 204 for producing a visible warning indication. In other embodiments, the warning signal output 36 may be coupled to a display 206, through a remote processor circuit (not shown) for displaying a warning on the display. In still other embodiments the warning signal output 36 may be coupled to a messaging device 208 for transmitting a warning message to the user by electronic mail, instant messaging service, telephone, or pager, for example. In the embodiment shown in FIG. 2 the solar panel interface 14 includes a local processor circuit 62 for controlling operation of the solar panel interface, and further includes a voltage sensor 58, which is configured to sense a voltage output from the solar panel and produce an output voltage signal representing a voltage output of the solar panel 12 as received at the input terminals 20 and 21. The solar panel interface 14 further includes a current sensor 60 for sensing a current output from the solar panel and for producing a current signal representing current supplied to the load 24. The voltage sensor 58 and the current sensor 60 are in communication with the local processor circuit 62 to enable the local processor circuit to produce the power signal at the output 26 for receipt by the power signal receiver 35.

Figure 3:
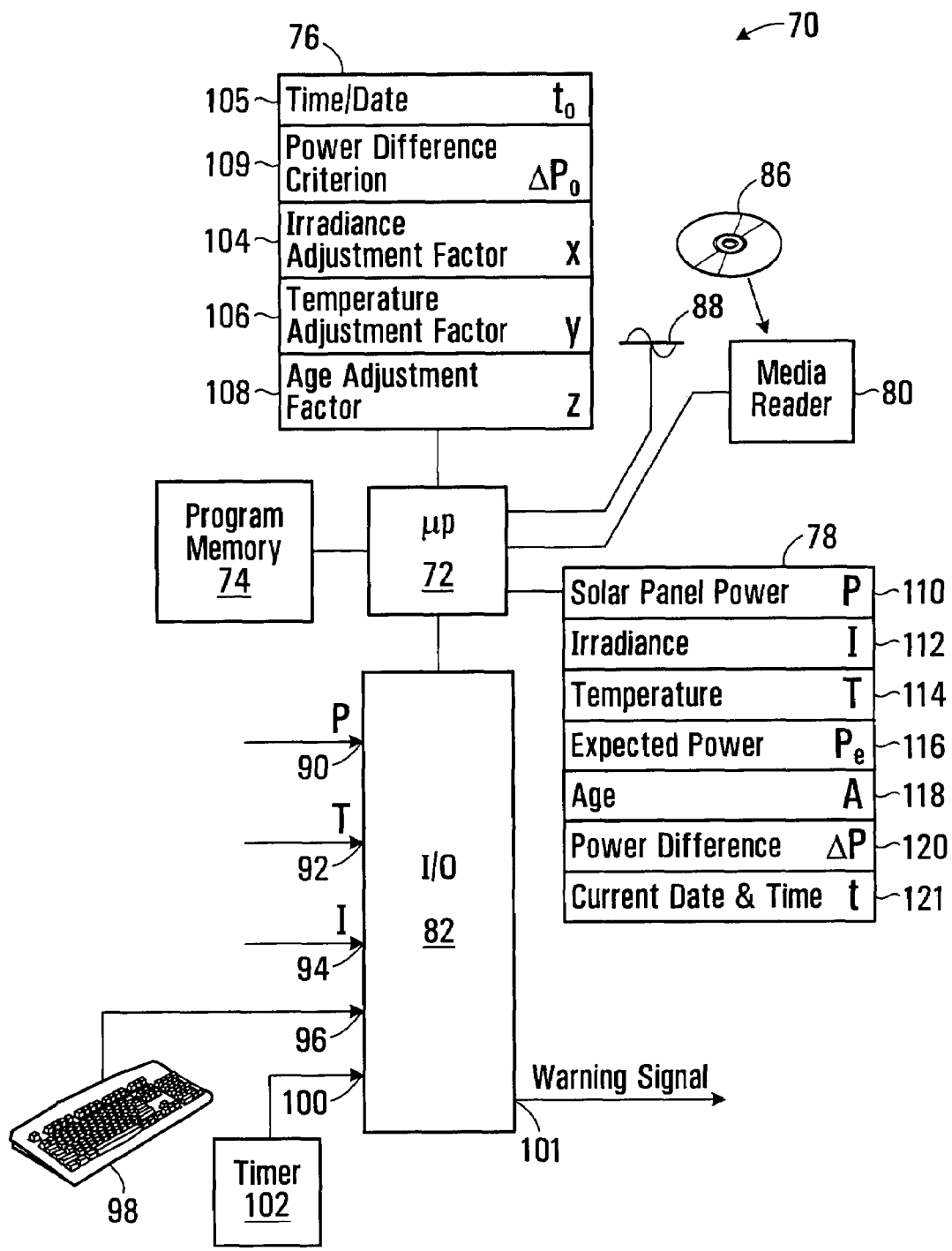
FIG. 3 is a schematic view of a processor circuit for implementing an apparatus for producing an indication of solar panel condition for the solar power generation system shown in FIG. 2.

The processor circuit 70 shown in FIG. 1 and FIG. 2 is shown in greater detail in FIG. 3. Referring to FIG. 3, the processor circuit 70 includes a microprocessor 72 and further includes a program memory 74, parameter memory 76, variable memory 78, a media reader 80, and an input/output port (I/O) 82, all of which are in communication with the microprocessor 72.

The media reader 80 facilitates loading program codes into the program memory 74 from a computer readable medium 86. The computer readable medium 86 may include a CD-ROM disk, which is encoded with program codes. Alternatively the processor circuit 70 may include a wired or wireless internet connection, and the program codes may be encoded in a computer readable signal 88, which is received at an input of the microprocessor 72.

Program codes for directing the microprocessor 72 to carry out various functions are stored in the program memory 74, which may be implemented as a random access memory (RAM) and/or a hard disk drive (HDD) or a combination thereof, for example The parameter memory 76 includes a plurality of storage locations, including a store 105 for storing a reference time and date ($t_0$), a store 109 for storing a power difference criterion ($\Delta P_0$), a store 104 for storing an irradiance adjustment factor (x), a store 106 for storing a temperature adjustment factor (y), and a store 108 for storing an age adjustment factor (z). The parameter memory 76 may be implemented in random access memory, for example.

The variable memory 78 includes a plurality of storage locations also referred to as stores including a store 110 for storing a solar panel power (P), a store 112 for storing an irradiance value (I), a store 114 for storing a temperature value (T), a store 116 for storing an expected power value ($P_e$), a store 118 for storing an age value (A), a store 120 for storing a power difference value ($\Delta P$), and a store 121 for storing a current date and time value hereinafter referred to as (t). The variable memory 78 may be implemented in random access memory, for example.

The I/O 82 includes an input 90 for receiving the power signal from the solar panel interface 14. The I/O 82 also includes an input 92 for receiving the temperature signal from the temperature sensor 52 (shown in FIG. 2), and an input 94 for receiving the irradiance signal from the irradiance measuring apparatus 28. The input 96 may be a keyboard input for example and the processor circuit may include a keyboard interface and related program codes that enable user input received at the keyboard 98. The keyboard 98 may therefore act as a receiver for receiving the temperature adjustment factor, age adjustment factor and/or irradiance adjustment factor, for example. The I/O 82 also includes an input 96 for receiving user input from a user input device 98, such as a keyboard for example and the processor circuit 70 may include a keyboard interface and related program codes that enable user input to be received at the keyboard. The keyboard 98 may therefore act as a receiver for receiving the temperature adjustment factor, age adjustment factor and/or irradiance adjustment factor, for example. The I/O 82 further includes an output 101 for producing the warning signal.

In this embodiment, the processor circuit 70 further includes a timer circuit 102, which is operably configured to produce a signal representing a current time/date, and the I/O 82 includes an input 100 for receiving the time/date signal from the timer circuit 102. Of course, the timer circuit 102 and/or any of the memories 74, 76, 78 and the I/O 82 may be integrated with the microprocessor 72.

Calibration Process

Figure 4:
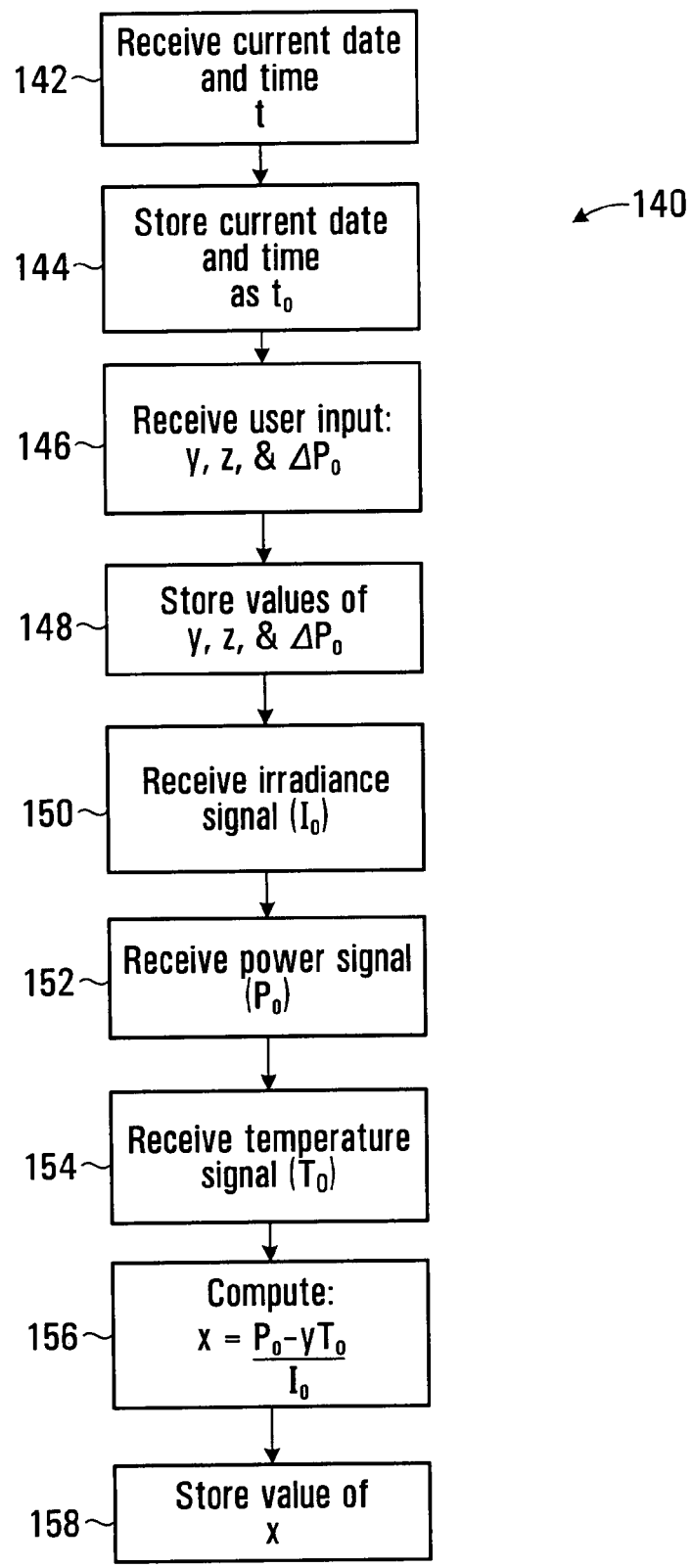
FIG. 4 is a flowchart of a calibration process executed by the processor circuit shown in FIG. 3.

Referring to FIG. 4, a flow chart depicting blocks of code for directing the microprocessor 72 to cause a calibration process to be carried out is shown generally at 140. The blocks generally represent codes that may be read from the computer readable medium 86 or the computer readable signal 88, and stored in the program memory 74, for directing the microprocessor 72 to perform various functions related to the calibration process. The actual code to implement each block may be written in any suitable program language, such as C, C++, and/or assembly code, for example.

The calibration process 140 is generally run only once at the time of installing the system 50 shown in FIG. 2, or when retrofitting a solar power generation system to include the apparatus 16 and is used to receive and/or produce and store certain variables for use in later calculations.

The calibration process 140 begins with a first block of codes 142 which direct the microprocessor 72 to cause the I/O 82 to receive a current date and time signal from the timer circuit 102 at the input 100 of the I/O 82. Block 144 then directs the microprocessor 72 to store the current date and time in the store 105 of the parameter memory 76. The stored value to represents a reference time at which the apparatus 16 and/or the system 50 was installed or started and facilitates later calculation of the age of the solar panel 12.

The calibration process 140 continues with block 146, which directs the microprocessor 72 to cause the I/O 82 to receive user input from the keyboard 98 at the input 96 of the I/O 82. In this embodiment, the user input includes the temperature adjustment factor y, the age adjustment factor z, and the power difference criterion $\Delta P_0$. The temperature and age adjustment factors may be provided by a data sheet published by a manufacturer of the solar panel 12, for example. The power difference criterion may be any user selectable value. A power difference criterion of say 10% may be suitable in many uses assuming an estimated power value as described below is accurate to about +/−5%.

Block 148 then directs the microprocessor 72 to cause the values of y, z, and $\Delta P_0$ to be stored in the parameter memory 76 in the stores 106, 108, and 109 respectively.

Alternatively, in embodiments where the system 50 is supplied as a unit, the values of y, z and $\Delta P_0$ may be permanently stored in the parameter memory 76 before the unit is shipped.

The calibration process 140 continues at block 150, which directs the microprocessor 72 to cause the I/O 82 to receive the irradiance signal at the input 94, and to store the value of the irradiance signal I in the store 112 of the variable memory 78.

Block 152 then directs the microprocessor 72 to cause the I/O 82 to receive the power signal at the input 90, and to store the value of the power signal P in the store 110 of the variable memory 78.

Block 154 then directs the microprocessor 72 to cause the I/O 82 to receive the temperature signal at the input 92 of the I/O 82, and to store the value of the power signal P in the store 114 of the variable memory 78.

Block 156 directs the microprocessor 72 to read the values of I, P, and T from the stores 110, 112, and 114 respectively and to compute the irradiance adjustment factor x, from the following equation:

$$x = \frac{P_o + yT_o}{I_o} \qquad \text{Eqn 1}$$

where:
x represents the irradiance adjustment factor
$P_0$ represents the power value at a reference time
$I_0$ represents the irradiance signal at the reference time
y represents the temperature adjustment factor
T represents the temperature signal.

In Eqn 1, the term "$yT_0$" is a correction to the Power value to account for the temperature of the solar panel, which has an effect on power conversion efficiency.

Block 158 then directs the microprocessor 72 to store the computed irradiance adjustment factor x in the store 104 of the parameter memory 76. Alternatively, the irradiance adjustment factor need not be computed by the microprocessor 72 and can be received as user input at the keyboard 98 and stored in the store 104 of the parameter memory 76. The irradiance adjustment factor x, for a metric measurement system, has the units of square meters ($m^2$) and generally represents the conversion efficiency of the solar panel 12 at the reference time $T_0$, which is typically the time (i.e. date) on which the solar panel is installed.

Operation

The operation of the apparatus 16 is described with reference to FIG. 3 and FIG. 5. Referring to FIG. 3, in general, the codes in the program memory 74 direct the processor circuit 70 to produce an expected power estimate $P_e$ in response to operating condition signals, including the irradiance signal I received at the input 94 and the power signal P received at the input 90, and irradiance and age adjustment factors x and z stored in stores 104 and 108 respectively of the parameter memory 76. The irradiance and age adjustment factors x and z are for adjusting the irradiance signal I and the age value A respectively. The power estimate $P_e$ represents an expected power output from the solar panel 12, and a warning signal is generated at the output 101 when a difference between the power signal P and the power estimate $P_e$ exceeds the power difference criterion $\Delta P_0$.

Figure 5:
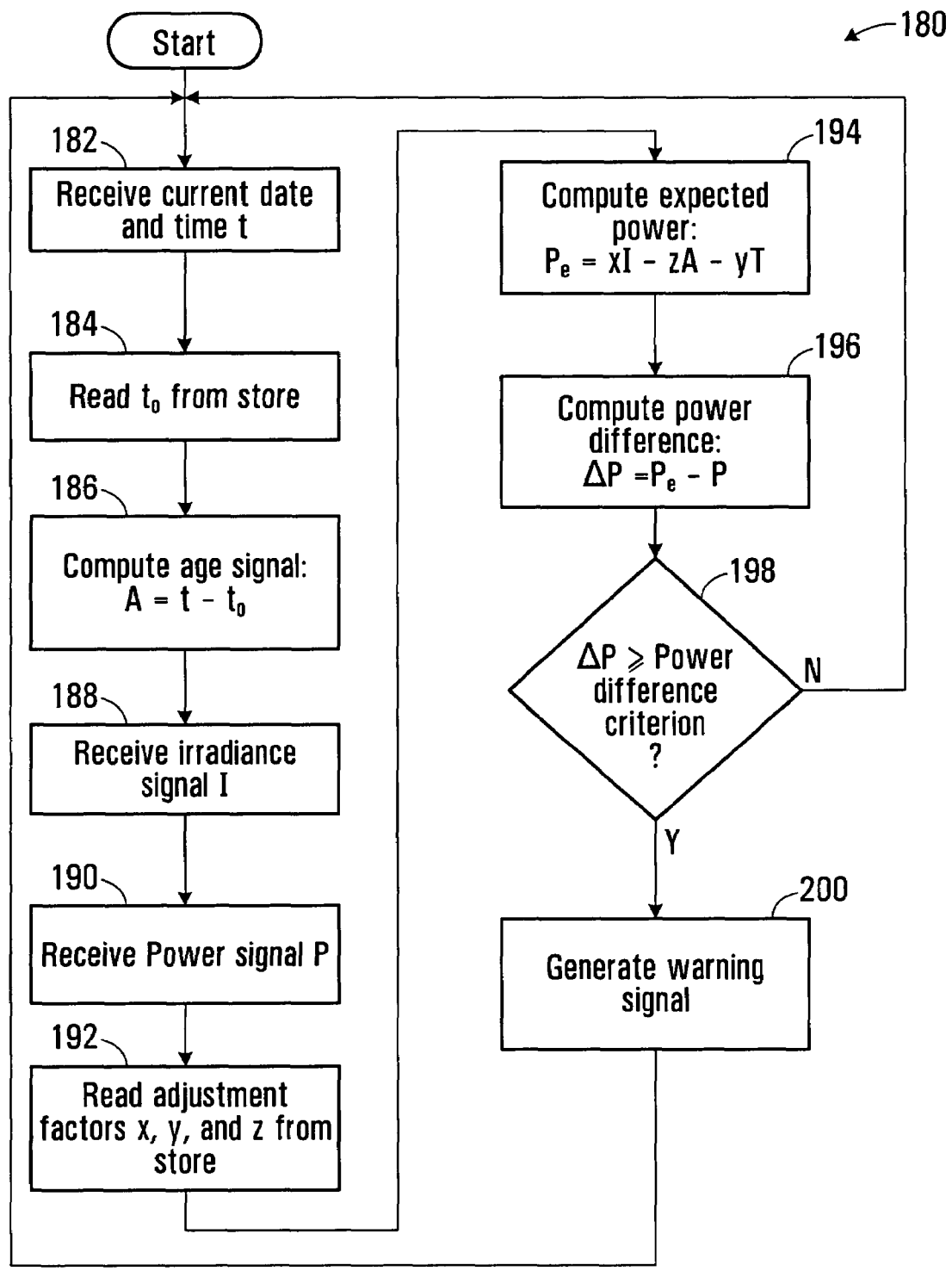
FIG. 5 is a flowchart of a process for producing an indication of solar panel condition executed by the processor circuit shown in FIG. 3.

Referring to FIG. 5, a process flow chart depicting blocks of code for directing the processor circuit 70 to carry out a method for producing an indication of solar panel condition is shown generally at 180. The process 180 begins with a first block of codes 182 which direct the microprocessor 72 to cause the current date and time t to be received from the timer 102 at the input 100 of the I/O 82, and to store the present value of t in the store 121 of the variable memory 78.

Block 184 then directs the microprocessor 72 to read the reference date/time value $t_0$ from the store 105 of the parameter memory 76 and block 186 directs the processor 72 to compute an age value A by taking the difference between the present value of t and the reference value $t_0$ from the following equation:

$$A = t - t_0 \qquad \text{Eqn 2}$$

The computed value of A is then stored in the store 118 of the variable memory 78.

Block 188 then directs the microprocessor 72 to cause the irradiance signal to be received at the input 94 of the I/O 82. Block 188 also causes the microprocessor 72 to store the value of the irradiance signal I in the store 112 of the variable memory 78.

Block 190 directs the microprocessor 72 to receive the power signal at the input 90 of the I/O 82, and to store the power signal value P in the store 110 of the variable memory 78.

Block 192 then directs the microprocessor 72 to obtain the irradiance adjustment factor x, the temperature adjustment factor y, and the age adjustment factor z, from the stores 104, 106, and 108 of the parameter memory 76 respectively.

Block 194 then directs the microprocessor 72 to compute the expected power $P_e$ using the following equation where the variables used in this equation are read from the appropriate store:

$$P_e = xI - zA - yT \qquad \text{Eqn 3}$$

where:
$P_e$ represents the power estimate
x represents the irradiance adjustment factor
I represents the irradiance signal
z represents the age adjustment factor
A represents the age value
y represents the temperature adjustment factor
T represents the temperature signal.

In some embodiments where the power conversion efficiency is not strongly dependent on temperature, the term "yT" in Eqn 3 may be regarded as a temperature term and may be omitted from Eqn 3.

The expected power $P_e$ represents an adjusted power output expected from the solar panel 12, taking into account present irradiance conditions, the temperature of the solar panel, and the age of the solar panel. Block 194 also directs the microprocessor 72 to store the value of $P_e$ in the store 116 of the variable memory 78.

Block 196 then directs the microprocessor 72 to read the values of $P_e$, and P from the stores 116 and 110 respectively of the variable memory 78, and to compute the power difference $\Delta P$ and to store the power difference in the store 120 of the variable memory 78.

Block 198 then directs the microprocessor 72 to compare the value of $\Delta P$ with the power difference criterion $\Delta P_0$ stored in the store 109 of the parameter memory 76. If $\Delta P$ is greater than the power difference criterion $\Delta P_0$, then the process 180 continues at block 200 which directs the microprocessor 72 to cause a warning signal to be generated at the output 101 of the I/O 82. The processor is then directed back to block 182 to resume the process.

If at block 198, $\Delta P$ is less than the power difference criterion $\Delta P_0$ then the microprocessor 72 is directed back to block 182 to resume the process without causing the warning signal to be produced. The power difference criterion $\Delta P_0$ represents an amount by which the actual power output from the solar panel is allowed to differ from the expected power output from the solar panel, before causing a warning signal to be produced at the output 101. In other words, if the estimated Power $P_e$ is greater than the actual power P by more than a reference difference, i.e. the power difference criterion $\Delta P_0$, the warning signal is generated. More generally, the processor circuit causes the warning signal to be produced when the power signal represents an actual power output less than the power estimate.

Referring back to FIG. 2, in one embodiment, the warning signal is received by a light controller (not shown) that causes a light 204 to be activated to signal a user of the system 50 to indicate that the solar panel condition does not meet the power difference criterion. In another embodiment, the warning signal may be received by a remote processor circuit (not shown) is configured to cause a message to be displayed on the display 206. In yet another embodiment, the warning signal may be received at the messaging device 208, which may cause a warning message to be transmitted to the user by electronic mail, instant messaging service, telephone, or pager, for example.

In general, the processor circuit 70 may be operably configured to cause the process 180 to be run periodically such as once per minute, once per hour, once per day or any other suitable period. In some embodiments where the system 50 is subjected to greater levels of contamination, it may be desirable to execute the process 180 more frequently.

Figure 6:
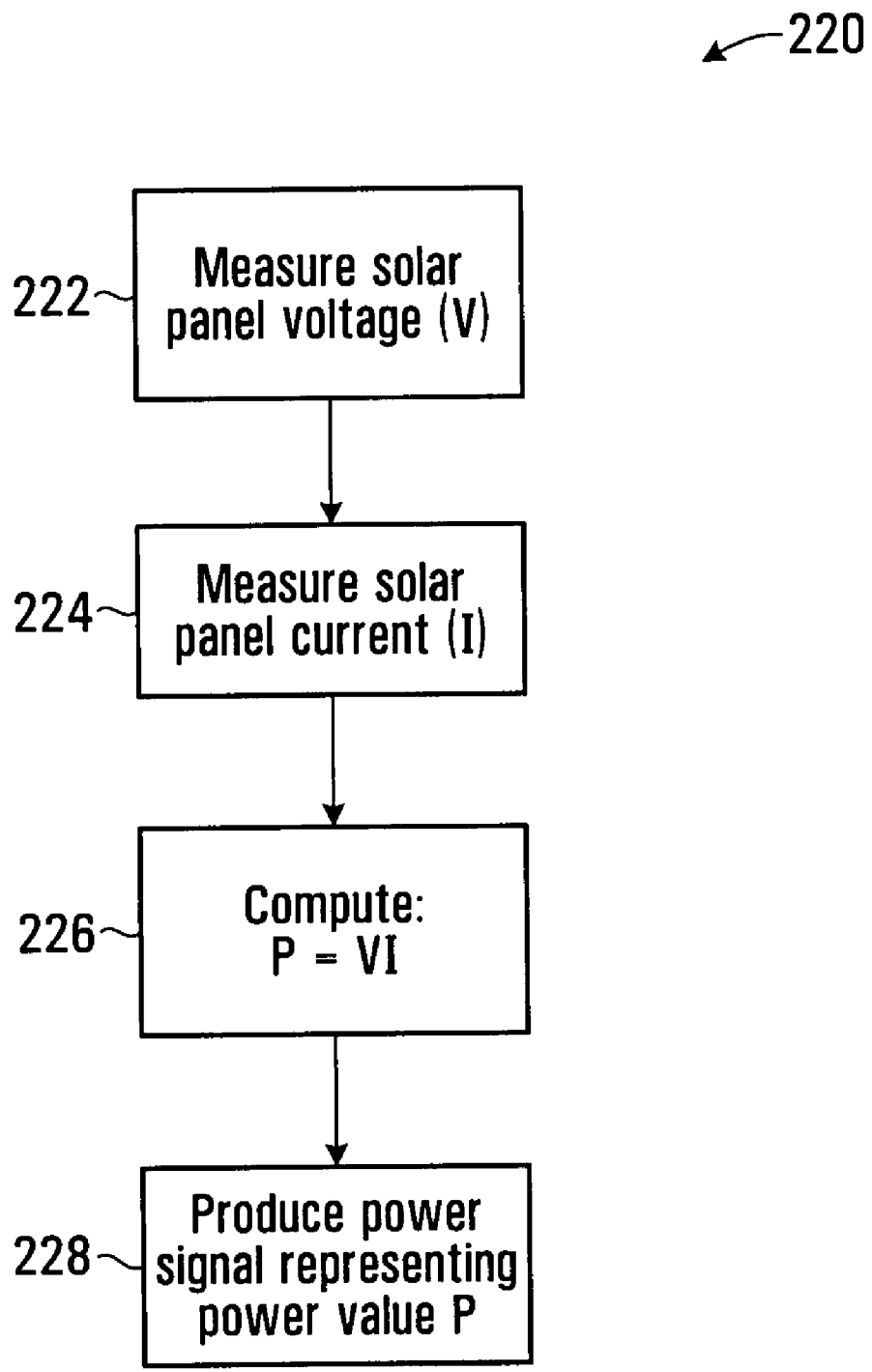
FIG. 6 is a flowchart of a process for producing a power signal for use in the process shown in FIG. 5.

Referring to FIG. 6, a process for generating the power signal P is shown generally at 220. This process may be executed by the processor circuit 62 in the solar panel interface 14 shown in FIG. 2, for example. The process starts at block 222 which directs the processor circuit 62 to measure the voltage at the solar panel output by communicating with the voltage sensor 58 (shown in FIG. 2) in the solar panel interface 14 to acquire a voltage value V. At block 224 the processor circuit 62 is directed to measure the solar panel current by communicating with the current sensor 60 in the solar panel interface 14 to acquire a current value I. The process 220 continues at block 226, which directs the processor circuit 62 to compute the electrical power output P by multiplying the measured voltage V by the measured current I. The process continues at block 228, which directs the processor circuit 62 to cause a power signal representing the computed power value P to be produced at the output 26 of the solar panel interface 14.

In an alternative embodiment, the solar panel interface 14 may measure the voltage and current using the sensors 58 and 60, and may transmit values representing solar panel voltage and current to the processor circuit 70 in the apparatus 16. In this case the blocks 226 and 228 may be executed by the processor circuit 70, rather than at the processor circuit 62 in the solar panel interface 14.

Signals representing power, irradiance, age, voltage, and/or current may be transmitted by wired or wireless connection between the solar panel interface 14 and the apparatus 16.

In general, the age adjustment factor x depends on properties of the materials used to produce the solar panel 12. For example, the power output of the solar panel 12 may reduce linearly as it ages, in which case the age adjustment factor x may be expressed in % power reduction per annum. For example, the age adjustment factor may account for a 0.5% per annum reduction in power output. In other embodiments, where the power output reduction over time is non-linear the age term "zA" in Eqn 3 may be replaced by the following which includes higher order terms:

$$zA = z_1 A + z_2 A^2 + \ldots \quad \text{Eqn 4}$$

where:
$z_1$, and $z_2$ are age adjustment factors, and
A is the actual age of the solar panel.

Similarly, where the output power of the solar panel 12 changes linearly with temperature the temperature adjustment factor y may be expressed as a % power reduction per degree Celsius change in temperature, for example. In other embodiments, where the power has a non-linear temperature dependence higher order terms may similarly be included, to more accurately reflect the non-linear dependence.

In general the apparatus 16 for producing an indication of solar panel condition provides a confirmation when solar panel system is operating optimally, thereby reducing the need for routine inspection of the solar panel. Furthermore, the warning signals generated by the apparatus 16 provide an early warning of potential contamination conditions that reduce electrical power output from the panels, which allows maintenance to be performed only when necessary.

While specific embodiments of the invention have been described and illustrated, such embodiments should be considered illustrative of the invention only and not as limiting the invention as construed in accordance with the accompanying claims.

What is claimed is:

1. A method for producing an indication of solar panel condition, the method comprising:
 receiving operating condition signals including:
  an irradiance signal representing electromagnetic radiation received by the solar panel;
  an age signal representing age of the solar panel;
 receiving a power signal representing actual power output from the solar panel;
 producing a power estimate in response to said operating condition signals and irradiance and age adjustment factors, said power estimate representing an expected power output from the solar panel and said adjustment factors for adjusting said irradiance signal and said age signal respectively; and
 causing a warning signal to be generated in response to a difference between said power signal and said power estimate.

2. The method of claim 1 wherein receiving said age signal comprises reading an age value from a store.

3. The method of claim 2 further comprising storing said age value in said store.

4. The method of claim 3 further comprising computing said age value in response to a signal received from a timer.

5. The method of claim 3 wherein producing said power estimate comprises computing said power estimate according to the relation:

$$P_e = xI - zA$$

where:
$P_e$ represents said power estimate
x represents said irradiance adjustment factor
I represents said irradiance signal
z represents said age adjustment factor
A represents said age signal.

6. The method of claim 1 further comprising receiving said irradiance adjustment factor.

7. The method of claim 1 further comprising computing said irradiance adjustment factor.

8. The method of claim 1 wherein receiving said operating condition signals comprises receiving a temperature signal representing temperature of the solar panel and wherein producing said power estimate comprises producing said power estimate in response to said operating condition signals and said irradiance and said age adjustment factors and a temperature adjustment factor, said temperature adjustment factor being operable to adjust said temperature signal.

9. The method of claim 8 wherein producing said power estimate comprises computing said power estimate according to the relation:

$$P_e = xI - zA - yT$$

where:
$P_e$ represents said power estimate
x represents said irradiance adjustment factor
z represents said age adjustment factor
A represents said age signal
I represents said irradiance signal
y represents said temperature adjustment factor
T represents said temperature signal.

10. The method of claim 9 further comprising producing said temperature signal.

11. The method of claim 10 wherein producing said temperature signal comprises operating a temperature sensor operably configured to sense a temperature of the solar panel.

12. The method of claim 8 wherein computing said irradiance adjustment factor comprises computing said irradiance adjustment factor according to the relation:

$$x = \frac{P_o + yT}{I_o}$$

where:
x represents said irradiance adjustment factor
$P_O$ represents said power signal at a reference time
$I_O$ represents said irradiance signal at said reference time
y represents said temperature adjustment factor
T represents said temperature signal.

13. The method of claim 12 further comprising storing said irradiance adjustment factor.

14. The method of claim 1 wherein causing said warning signal to be produced comprises causing said warning signal to be produced when said power signal represents an actual power output less than said power estimate.

15. The method of claim 1 wherein causing said warning signal to be produced comprises causing said warning signal to be produced when said power signal represents an actual power output that differs from said power estimate by more than a reference difference.

16. The method of claim 15 wherein causing said warning signal to be produced comprises actuating a light.

17. The method of claim 15 wherein causing said warning signal to be produced comprises causing a message to be displayed.

18. The method of claim 15 wherein causing said warning signal to be produced comprises causing a message to be transmitted to a messaging device.

19. The method of claim 1 further comprising producing said warning signal.

20. The method of claim 1 further comprising producing said power signal.

21. The method of claim 20 wherein producing said power signal comprises measuring current and voltage output from the solar panel and calculating an actual power value and producing said power signal in response to said actual power value.

22. The method of claim 1 further comprising producing said irradiance signal.

23. The method of claim 22 wherein producing said irradiance signal comprises operating an irradiance measurement apparatus operably configured to produce said irradiance signal.

24. A computer readable medium encoded with codes for directing a processor circuit to execute the method of claim 1.

25. A computer readable signal encoded with codes for directing a processor circuit to execute the method of claim 1.

26. An apparatus for producing an indication of solar panel condition, the apparatus comprising:
   means for receiving operating condition signals including:
      an irradiance signal representing electromagnetic radiation received by the solar panel,
      an age signal representing age of the solar panel;
   means for receiving a power signal representing actual power output from the solar panel;
   means for producing a power estimate in response to said operating condition signals and irradiance and age adjustment factors, said power estimate representing an expected power output from the solar panel and said adjustment factors for adjusting said irradiance signal and said age signal respectively; and
   means for causing a warning signal to be generated in response to a difference between said power signal and said power estimate.

27. The apparatus of claim 26 wherein said means for receiving comprises means for reading an age value from a store.

28. The apparatus of claim 27 further comprising means for storing said age value in said store.

29. The apparatus of claim 28 further comprising means for computing said age value in response to a signal received from a timer.

30. The apparatus of claim 28 wherein said means for producing said power estimate comprises means for computing said power estimate according to the relation:

$$P_e = xI - zA$$

where:
   $P_e$ represents said power estimate
   x represents said irradiance adjustment factor
   z represents said age adjustment factor
   I represents said irradiance signal
   A represents said age signal.

31. The apparatus of claim 26 further comprising means for receiving said irradiance adjustment factor.

32. The apparatus of claim 26 further comprising means for computing said irradiance adjustment factor.

33. The apparatus of claim 26 wherein said means for receiving said operating condition signals comprises means for receiving a temperature signal representing temperature of the solar panel and wherein said means for producing said power estimate comprises means for producing said power estimate in response to said operating condition signals and said irradiance and said age adjustment factors and a temperature adjustment factor, said temperature adjustment factor being operable to adjust said temperature signal.

34. The apparatus of claim 33 wherein said means for producing said power estimate comprises means for computing said power estimate according to the relation:

$$P_e = xI - zA - yT$$

where:
   $P_e$ represents said power estimate
   x represents said irradiance adjustment factor
   z represents said age adjustment factor
   A represents said age signal
   I represents said irradiance signal
   y represents said temperature adjustment factor
   T represents said temperature signal.

35. The apparatus of claim 34 further comprising means for producing said temperature signal.

36. The apparatus of claim 35 wherein said means for producing said temperature signal comprises means for sensing a temperature of the solar panel.

37. The apparatus of claim 33 wherein said means for computing said irradiance adjustment factor comprises means for computing said irradiance adjustment factor according to the relation:

$$x = \frac{P_o + yT}{I_o}$$

where:
   x represents said irradiance adjustment factor
   $P_O$ represents said power signal at a reference time
   $I_O$ represents said irradiance signal at said reference time
   y represents said temperature adjustment factor
   T represents said temperature signal.

38. The apparatus of claim 37 further comprising means for storing said irradiance adjustment factor.

39. The apparatus of claim 26 wherein said means for causing said warning signal to be produced comprises means for causing said warning signal to be produced when said power signal represents an actual power output less than said power estimate.

40. The apparatus of claim 26 wherein said means for causing said warning signal to be produced comprises means for causing said warning signal to be produced when said power signal represents an actual power output that differs from said power estimate by more than a reference difference.

41. The apparatus of claim 40 wherein said means for causing said warning signal to be produced comprises means for actuating a light.

42. The apparatus of claim 40 wherein said means for causing said warning signal to be produced comprises means for causing a message to be displayed.

43. The apparatus of claim 40 wherein said means for causing said warning signal to be produced comprises means for causing a message to be transmitted to a messaging device.

44. The apparatus of claim 26 further comprising means for producing said warning signal.

45. The apparatus of claim 26 further comprising means for producing said power signal.

46. The apparatus of claim 45 wherein said means for producing said power signal comprises means for measuring current and voltage output from the solar panel and means for calculating an actual power value and producing said power signal in response to said actual power value.

47. The apparatus of claim 26 further comprising means for producing said irradiance signal.

48. The apparatus of claim 47 wherein said means for producing said irradiance signal comprises means for operating an irradiance measurement apparatus operably configured to produce said irradiance signal.

49. An apparatus for producing an indication of solar panel condition, the apparatus comprising:
   an operating condition receiver operably configured to receive operating condition signals including:
      an irradiance signal representing electromagnetic radiation received by the solar panel,
      an age signal representing age of the solar panel;
   a power signal receiver operably configured to receive a power signal representing actual power output from the solar panel;
   a processor circuit operably configured to:
      produce a power estimate in response to said operating condition signals and irradiance and age adjustment factors, said power estimate representing an expected power output from the solar panel and said adjustment factors for adjusting said irradiance signal and said age signal respectively; and
      cause a warning signal to be generated in response to a difference between said power signal and said power estimate.

50. The apparatus of claim 49 wherein said operating condition receiver is operably configured to read an age value from a store.

51. The apparatus of claim 50 further comprising a memory store operably configured to store said age value.

52. The apparatus of claim 51 wherein said processor circuit is operably configured to compute said age value in response to a signal received from a timer.

53. The apparatus of claim 51 wherein said processor circuit is operably configured to compute said power estimate according to the relation:

$P_e = xI - zA$ where:
   $P_e$ represents said power estimate
   x represents said irradiance adjustment factor
   z represents said age adjustment factor
   I represents said irradiance signal
   A represents said age signal.

54. The apparatus of claim 49 further comprising a receiver for receiving said irradiance adjustment factor.

55. The apparatus of claim 49 wherein said processor circuit is operably configured to compute said irradiance adjustment factor.

56. The apparatus of claim 49 wherein said receiver is operably configured to receive a temperature signal representing temperature of the solar panel and wherein said processor circuit is operably configured to produce said power estimate in response to said operating condition signals and said irradiance and said age adjustment factors and a temperature adjustment factor, said temperature adjustment factor being operable to adjust said temperature signal.

57. The apparatus of claim 56 wherein said processor circuit is operably configured to compute said power estimate according to the relation:

$P_e = xI - zA - yT$ where:
   $P_e$ represents said power estimate
   x represents said irradiance adjustment factor
   z represents said age adjustment factor
   A represents said age signal
   I represents said irradiance signal
   y represents said temperature adjustment factor
   T represents said temperature signal.

58. The apparatus of claim 57 further comprising a temperature sensor operably configured to sense a temperature of the solar panel and to produce said temperature signal.

59. The apparatus of claim 56 wherein said processor circuit is operably configured to compute said irradiance adjustment factor according to the relation:

$$x = \frac{P_o + yT}{I_o}$$

where:
   x represents said irradiance adjustment factor
   $P_o$ represents said power signal at a reference time
   $I_o$ represents said irradiance signal at said reference time
   y represents said temperature adjustment factor
   T represents said temperature signal.

60. The apparatus of claim 59 further comprising a memory store operably configured to storing said irradiance adjustment factor.

61. The apparatus of claim 49 wherein said processor circuit is operably configured to cause said warning signal to be produced when said power signal represents an actual power output less than said power estimate.

62. The apparatus of claim 49 wherein said processor circuit is operably configured causing said warning signal to be produced when said power signal represents an actual power output that differs from said power estimate by more than a reference difference.

63. The apparatus of claim 62 wherein said processor circuit is operably configured to actuate a light.

64. The apparatus of claim 62 wherein said processor circuit is operably configured to cause a message to be displayed.

65. The apparatus of claim 62 wherein said processor circuit is operably configured to cause a message to be transmitted to a messaging device.

66. The apparatus of claim 49 further comprising a power sensor operably configured to sense actual power output from the solar panel and to produce said power signal.

67. The apparatus of claim 49 further comprising:
   a voltage sensor for sensing a voltage output from the solar panel and for producing a voltage signal representing said voltage output;
   a current sensor for sensing a current output from the solar panel and for producing a current signal representing said current output;
   a receiver for receiving said voltage signal and said current signal;
   a processor circuit operably configured to calculate an actual power value from said current signal and said voltage signal and to produce said power signal in response to said actual power value.

68. The apparatus of claim 49 further comprising an irradiance sensor operably configured to producing said irradiance signal.

69. A solar power system comprising the apparatus of claim 49 and further comprising:
 a solar panel, said solar panel being operable to produce an output power at an output power terminal; and
 an irradiance measuring apparatus operable to produce said irradiance signal.

70. The system of claim 69 further comprising a temperature sensor, said temperature sensor being operably configured to measure said temperature of the solar panel and to produce said temperature signal.

71. The system of claim 69 further comprising a solar panel interface, said interface being operably configured to receive said output power and to condition said power for use in driving a load.

72. The system of claim 71 wherein said interface is operably configured to produce said power signal.

* * * * *